US012720687B2

(12) United States Patent
Lu et al.

(10) Patent No.: US 12,720,687 B2
(45) Date of Patent: Aug. 25, 2026

(54) ELECTRONIC DEVICE AND SUSPENSION STRUCTURE THEREOF

(71) Applicant: Wistron NeWeb Corp., Hsinchu (TW)

(72) Inventors: Liang-Cheng Lu, Hsinchu (TW); Hsueh-Chu Lin, Hsinchu (TW); Chiu-Hui Wu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 98 days.

(21) Appl. No.: 18/782,694

(22) Filed: Jul. 24, 2024

(65) Prior Publication Data

US 2025/0081365 A1 Mar. 6, 2025

(30) Foreign Application Priority Data

Aug. 30, 2023 (TW) ................................ 112132748

(51) Int. Cl.
*H05K 5/02* (2006.01)
*F16M 13/02* (2006.01)

(52) U.S. Cl.
CPC ........... *H05K 5/0204* (2013.01); *F16M 13/02* (2013.01)

(58) Field of Classification Search
CPC .... H05K 5/0204; F16M 13/02; F16M 11/041; F16M 11/10; F16M 11/16
USPC ............................................ 248/317, 222.52
See application file for complete search history.

(56) References Cited

U.S. PATENT DOCUMENTS 6,007,136 A * 12/1999 Zittwitz ................. B60J 3/0221 248/222.12
6,340,146 B1 * 1/2002 Tzeng ............... G02F 1/133308 16/270
7,077,372 B2 * 7/2006 Moran ................... A61B 90/39 248/221.11
7,594,823 B2 * 9/2009 Moscovitch ........... F16M 13/00 248/917
7,837,164 B1 * 11/2010 Getgood ................. E04H 15/64 248/220.21
8,020,821 B2 * 9/2011 Chen ...................... F16M 13/02 248/221.11
8,146,227 B2 * 4/2012 Schmitz .................. B60R 5/003 312/246
8,465,221 B2 * 6/2013 Yan ...................... H05K 7/1489 403/348
9,404,615 B1 * 8/2016 Gonzalez ............ H05K 5/0208

(Continued)

FOREIGN PATENT DOCUMENTS

CN 102711398 A 10/2012
TW 202332359 A 8/2023

*Primary Examiner* — Muhammad Ijaz
(74) *Attorney, Agent, or Firm* — McClure, Qualey & Rodack, LLP

(57) ABSTRACT

An electronic device is provided. The electronic device is adapted to be disposed on a mounting surface. The electronic device includes a device body, a connection base and a bracket. The connection base is connected to the device body. The connection base is adapted to be rotated between a first orientation and a second orientation relative to the device body. When the connection base is in the first orientation, the connection base is connected to the device body. When the connection base is in the second orientation, the connection base is separated from the device body. The bracket is wedged against the connection base, wherein the bracket is adapted to be affixed to the mounting surface.

16 Claims, 13 Drawing Sheets

(56) References Cited

U.S. PATENT DOCUMENTS

| | | | | |
|---|---|---|---|---|
| 9,714,529 | B1 * | 7/2017 | Conklin | H05K 5/0204 |
| 10,330,240 | B1 * | 6/2019 | Cho | H04Q 1/06 |
| 11,946,592 | B2 | 4/2024 | Yang et al. | |
| 2006/0065804 | A1 * | 3/2006 | Burriel | F16M 11/22 248/316.1 |
| 2007/0097617 | A1 * | 5/2007 | Searby | F16M 11/041 361/679.21 |
| 2008/0105803 | A1 * | 5/2008 | Tu | H05K 5/0204 248/220.22 |
| 2008/0197257 | A1 * | 8/2008 | Stoelinga | F16M 11/2014 248/278.1 |
| 2010/0061043 | A1 * | 3/2010 | Hsieh | F16M 11/16 361/679.01 |
| 2011/0146163 | A1 * | 6/2011 | Naroditsky | H05K 5/0204 52/27 |
| 2012/0014046 | A1 * | 1/2012 | Kuan | H05K 5/0204 361/679.01 |
| 2012/0293925 | A1 * | 11/2012 | Su | F16M 13/02 361/679.01 |
| 2016/0320801 | A1 * | 11/2016 | Buss | G06F 1/1632 |
| 2020/0063909 | A1 * | 2/2020 | Weng | F16M 13/02 |
| 2022/0381288 | A1 * | 12/2022 | Chen | F16B 47/006 |
| 2022/0417356 | A1 * | 12/2022 | Chiang | F16B 5/0621 |
| 2025/0081365 | A1 * | 3/2025 | Lu | F16M 11/10 |
| 2025/0126725 | A1 * | 4/2025 | Ramones | H05K 5/0204 |

* cited by examiner

E4

ELECTRONIC DEVICE AND SUSPENSION STRUCTURE THEREOF

CROSS REFERENCE TO RELATED APPLICATIONS

This application claims priority of Taiwan Patent Application No. 112132748, filed on Aug. 30, 2023, the entirety of which is incorporated by reference herein.

BACKGROUND OF THE INVENTION

Field of the Invention

The present invention relates to an electronic device, and, in particular, to an electronic device with suspension structure.

Description of the Related Art

Conventional electronic devices (such as wireless routers) are often affixed to ceilings or walls via suspension structures. Conventionally, a conventional electronic device can be connected to a suspension structure using bolts. Therefore, the user must use hand tools such as a wrench to perform the installation. This is inconvenient. Additionally, the mounting surface (for example, the ceiling or wall) may be vertical, horizontal or an inclined surface. A single suspension structure cannot satisfy these different installation requirements, and the installation of electronic devices are thus more complicated.

BRIEF SUMMARY OF THE INVENTION

An embodiment of the present invention provides an electronic device. The electronic device is adapted to be disposed on a mounting surface. The electronic device includes a device body, a connection base and a bracket. The connection base is connected to the device body. The connection base is adapted to be rotated between a first orientation and a second orientation relative to the device body. When the connection base is in the first orientation, the connection base is connected to the device body. When the connection base is in the second orientation, the connection base is separated from the device body. The bracket is wedged against the connection base, wherein the bracket is adapted to be affixed to the mounting surface.

In one embodiment, a suspension structure is provided. The suspension structure is adapted to be disposed on a mounting surface. The suspension structure includes a connection base and a bracket. The connection base includes a second hook and a positioning protrusion. The bracket includes a bracket connection slot. The bracket is adapted to be affixed to the mounting surface. The second hook is connected to the bracket connection slot. A first restriction portion and a first positioning notch are formed in the bracket connection slot. In a first connection state, the second hook abuts the first restriction portion, the positioning protrusion is wedged against the first positioning notch, and the connection base is in a first position relative to the bracket.

In the embodiment of the invention, the connection base is rotatably assembled to the device body. The connecting base is wedged against the bracket. The device body, the connection base and the bracket of the embodiment of the invention can be assembled each other without bolts. Utilizing the electronic device of the embodiment of the invention, the use of hand tools such as screwdrivers in the installation process can be significantly reduced, and the installation operations are easier for users.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1A:
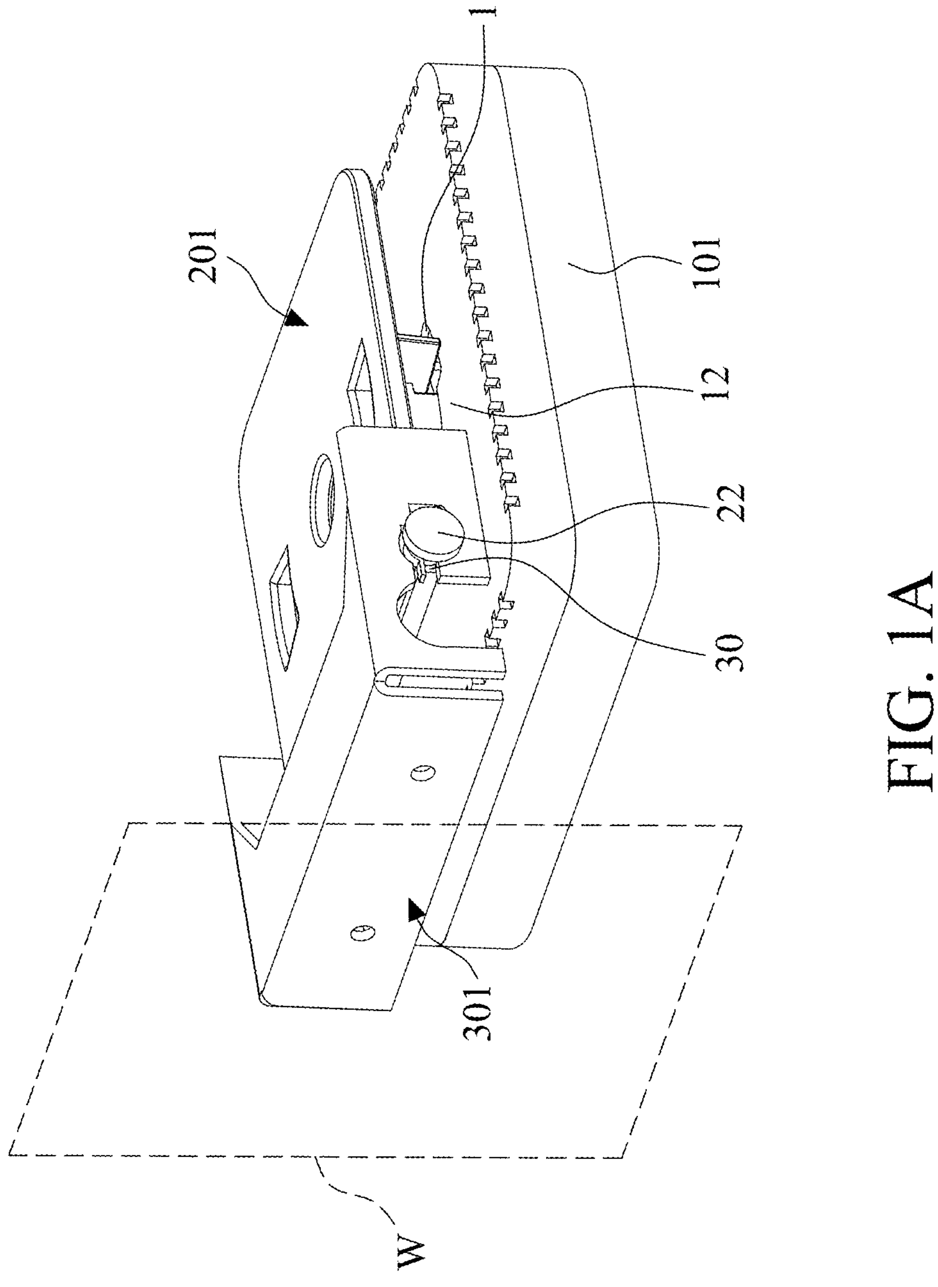
FIG. 1A is an assembled view of an electronic device of a first embodiment of the invention, wherein the connection base is in a first orientation relative to the device body.
Figure 1B:
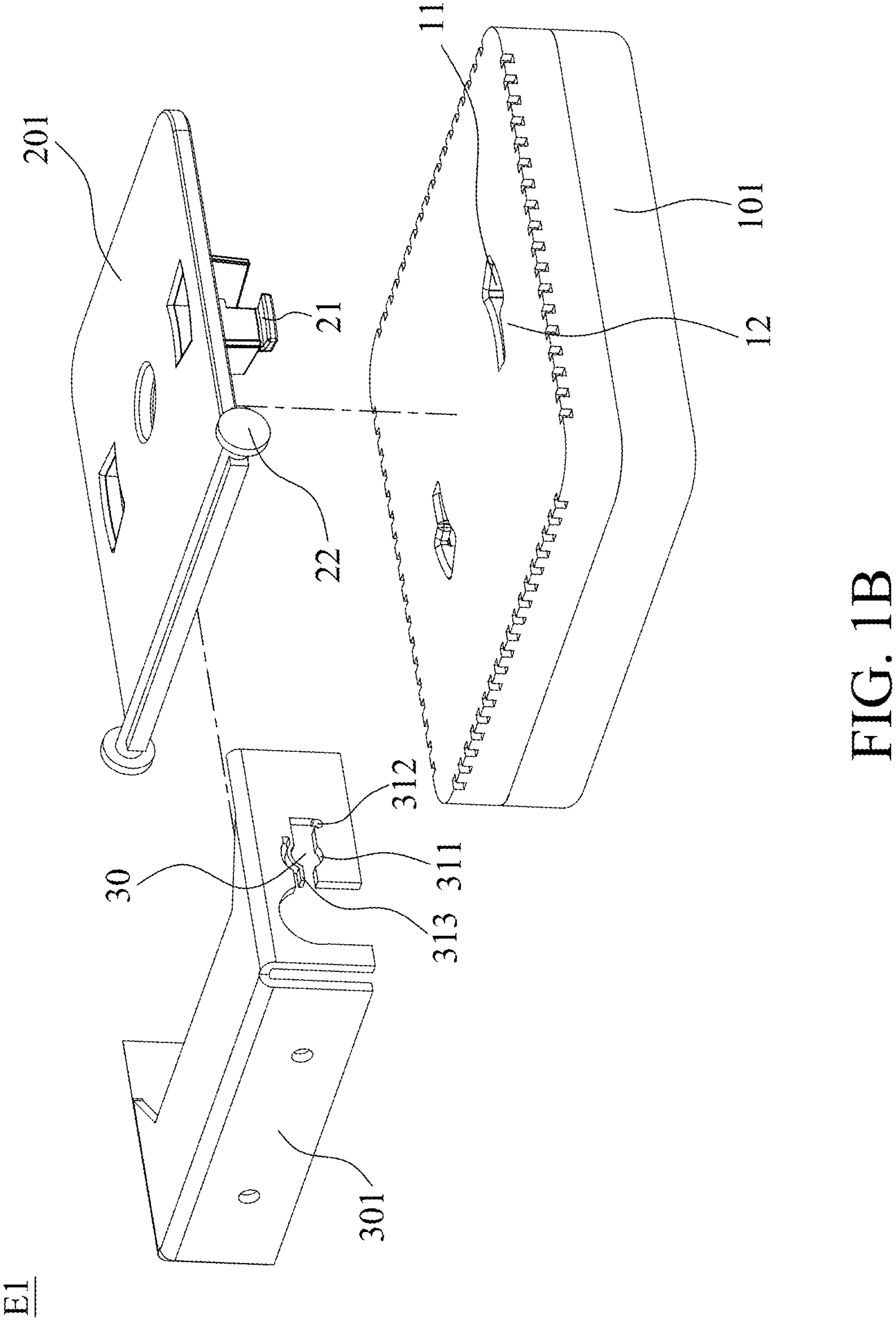
FIG. 1B is an exploded view of the electronic device of the first embodiment of the invention.

FIG. 1A is an assembled view of an electronic device of a first embodiment of the invention, wherein the connection base is in a first orientation relative to the device body. FIG. 1B is an exploded view of the electronic device of the first embodiment of the invention. With reference to FIGS. 1A and 1B, the electronic device E1 of the embodiment of the invention is adapted to be disposed on a mounting surface W (for example, a wall). The electronic device E1 includes a device body 101, a connection base 201 and a bracket 301. The connection base 201 is connected to the device body 101. The bracket 301 is wedged against the connection base 201. The bracket 301 is adapted to be affixed to the mounting surface W.

Figure 2:
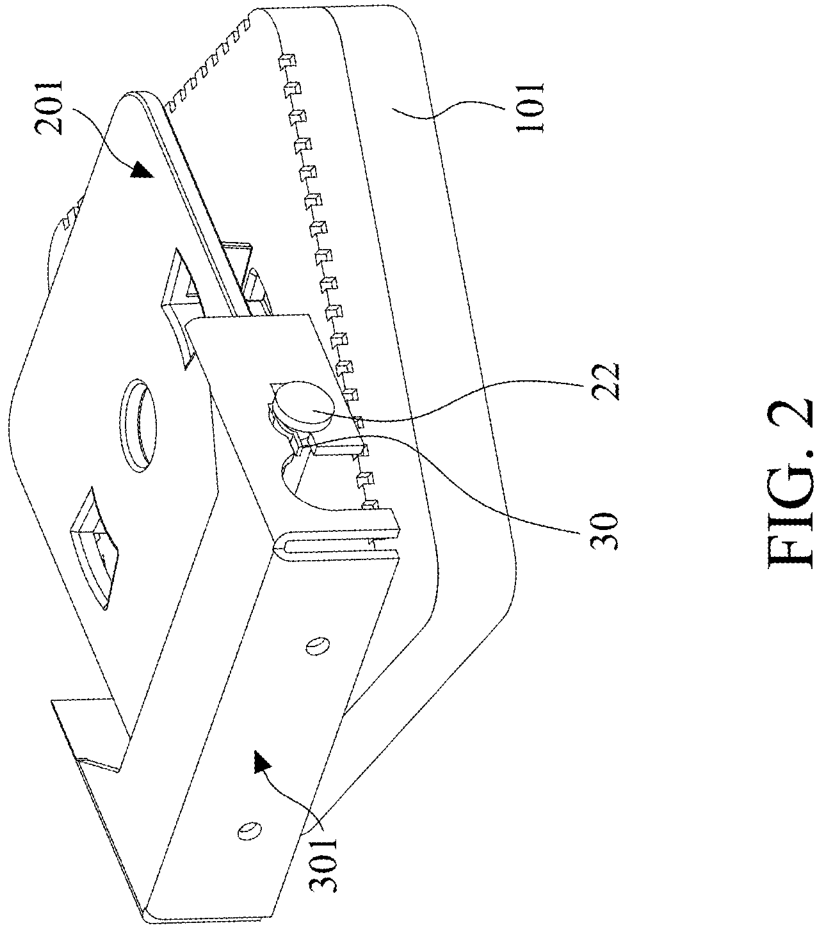
FIG. 2 is a top view of the electronic device of the first embodiment of the invention, wherein the connection base is in a second orientation relative to the device body.

FIG. 2 is a top view of the electronic device of the first embodiment of the invention, wherein the connection base is in a second orientation relative to the device body. With reference to FIGS. 1A and 2, the connection base 201 is adapted to be rotated between a first orientation and a second orientation relative to the device body 101. When the connection base 201 is in the first orientation (FIG. 1A), the connection base 201 is connected to the device body 101. When the connection base 201 is in the second orientation (FIG. 2), the connection base 201 is separated from the device body 101.

With reference to FIGS. 1A and 1B, in one embodiment, the connection base 201 comprises a first hook 21. The device body 101 comprises a device slot 11 and a device abutting portion 12. The device abutting portion 12 is connected to the device slot 11. When the connection base 201 is in the first orientation, the first hook 21 abuts the device abutting portion 12. When the connection base 201 is in the second orientation, the first hook 21 is separated from the device slot 11.

Figure 3A:
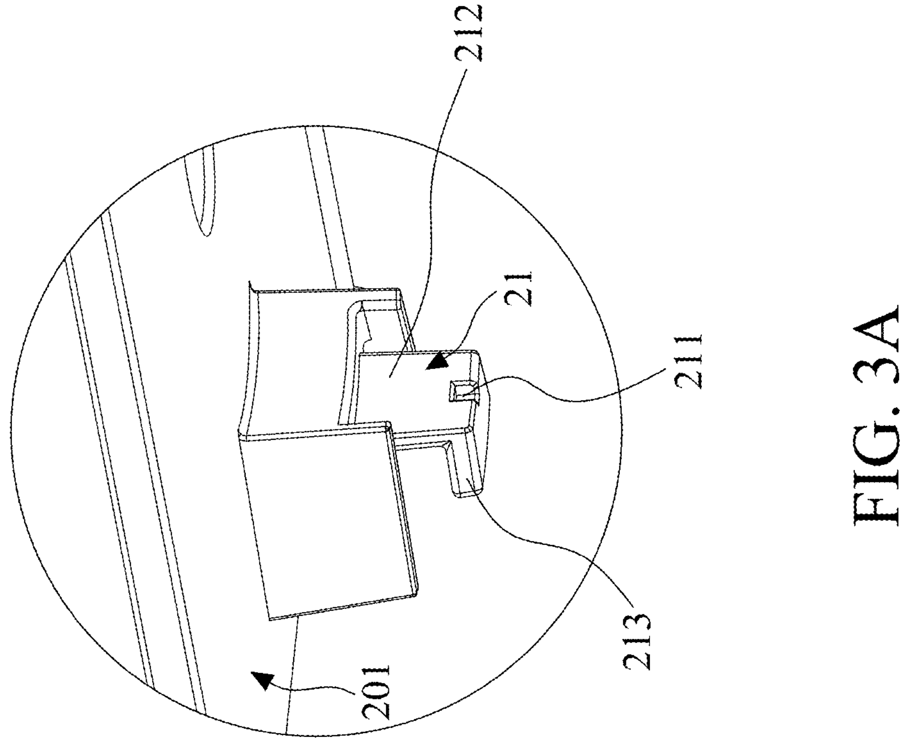
FIG. 3A shows the details of the first hook of the first embodiment of the invention.
Figure 3B:
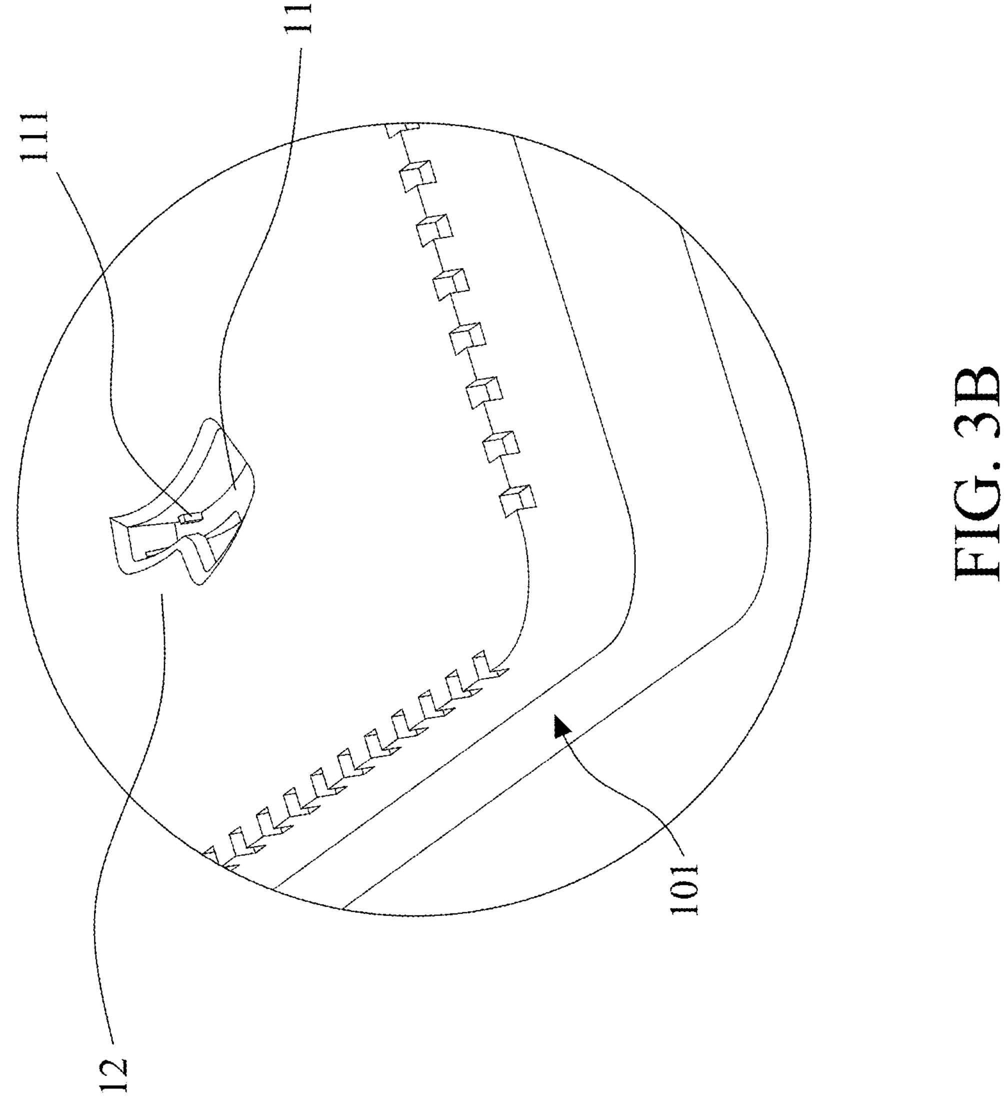
FIG. 3B shows the details of the device positioning portion of the first embodiment of the invention.
Figure 3C:
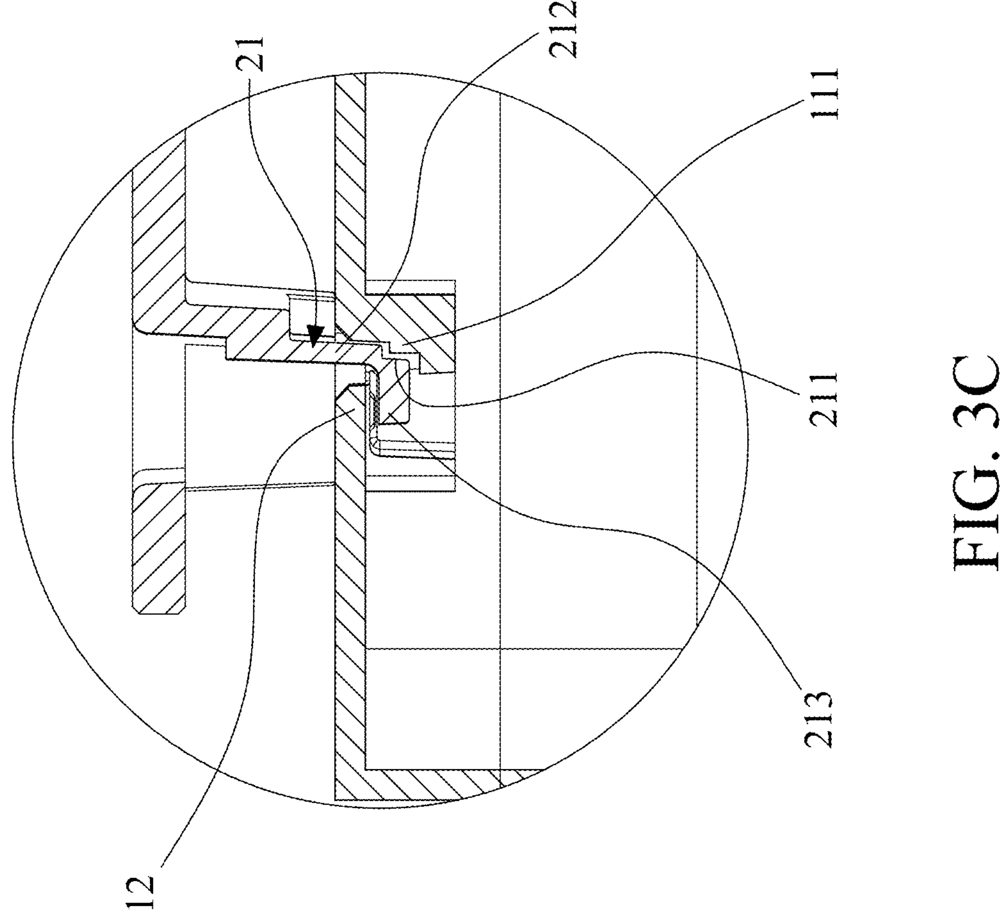
FIG. 3C shows the device positioning portion wedged against the first hook positioning portion of the first embodiment of the invention.

FIG. 3A shows the details of the first hook of the first embodiment of the invention. FIG. 3B shows the details of the device positioning portion of the first embodiment of the invention. FIG. 3C shows the device positioning portion wedged against the first hook positioning portion of the first embodiment of the invention. With reference to FIGS. 3A, 3B and 3C, in one embodiment, a first hook positioning portion 211 is formed on the first hook 21. A device positioning portion 111 is formed in the device slot 11. When the connection base is in the first orientation, the device positioning portion 111 is wedged against the first hook positioning portion 211.

With reference to FIGS. 3A, 3B and 3C, in one embodiment, the first hook positioning portion 211 is a wedging opening. The device positioning portion 111 is a wedging protrusion. The wedging protrusion is adapted to be wedged against the wedging opening. In the embodiment of the invention, the device positioning portion 111 is wedged against the first hook positioning portion 211 to restrict the movement of the connection base, and to provide tactile sense for user.

With reference to FIGS. 3A, 3B and 3C, in one embodiment, the first hook 21 comprises a hook extending portion 212 and a hook abutting portion 213. The hook abutting portion 213 abuts the device abutting portion 12, and the first hook positioning portion 211 is formed on the hook extending portion 212.

With reference to FIGS. 1A and 1B, in one embodiment, the bracket 301 comprises a bracket connection slot 30. The connection base 201 comprises a second hook 22. The second hook 22 is connected to the bracket connection slot 30.

Figure 4B:
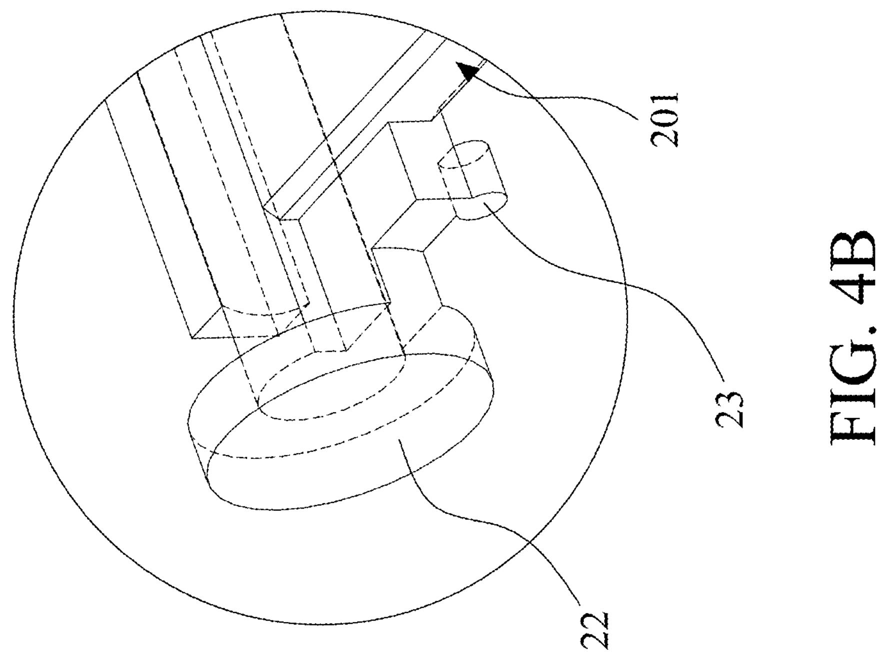
FIG. 4B shows the details of the second hook of the first embodiment of the invention.
Figure 4A:
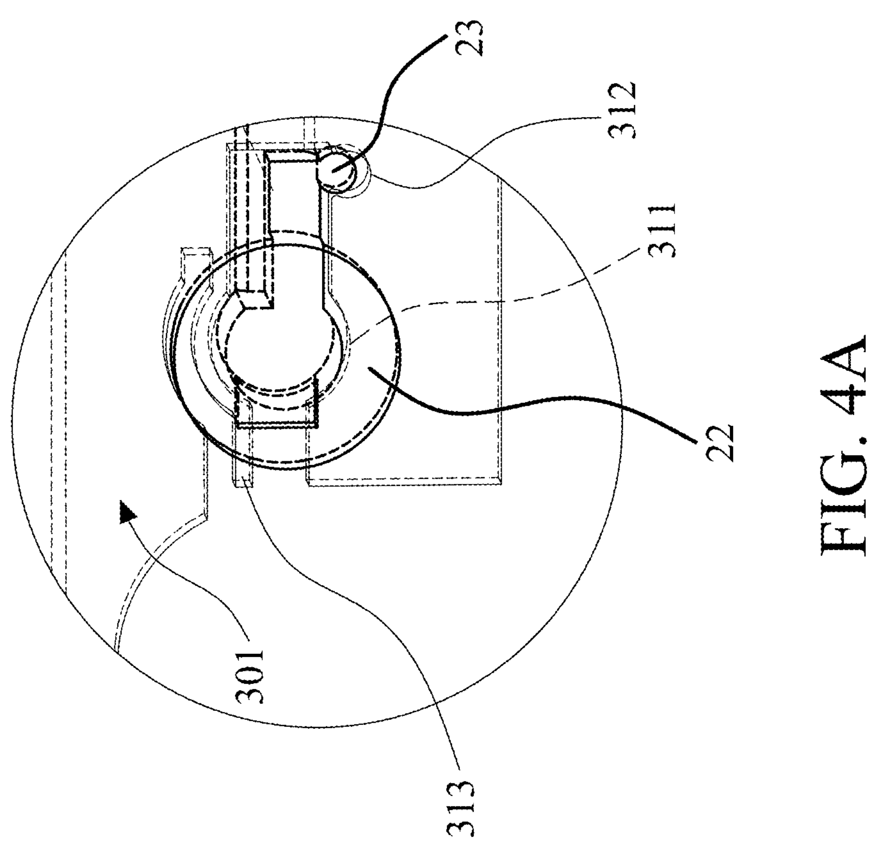
FIG. 4A shows the second hook connected to the bracket connection slot of the first embodiment of the invention.

FIG. 4A shows the second hook connected to the bracket connection slot of the first embodiment of the invention. FIG. 4B shows the details of the second hook of the first embodiment of the invention. With reference to FIGS. 1A, 1B, 4A and 4B, in one embodiment, a first restriction portion 311 and a first positioning notch 312 are formed in the bracket connection slot 30. The connection base 201 further comprises a positioning protrusion 23. In a first connection state, the second hook 22 abuts the first restriction portion 311. The positioning protrusion 23 is wedged against the first positioning notch 312. The connection base 201 is in a first position relative to the bracket 301.

With reference to FIGS. 1B and 4A, in one embodiment, the bracket 301 comprises an elastic sheet 313. The elastic sheet 313 is disposed in the bracket connection slot 30. In the first connection state, the elastic sheet 313 abuts the second hook 22 and restricts the second hook 22.

Figure 5A:
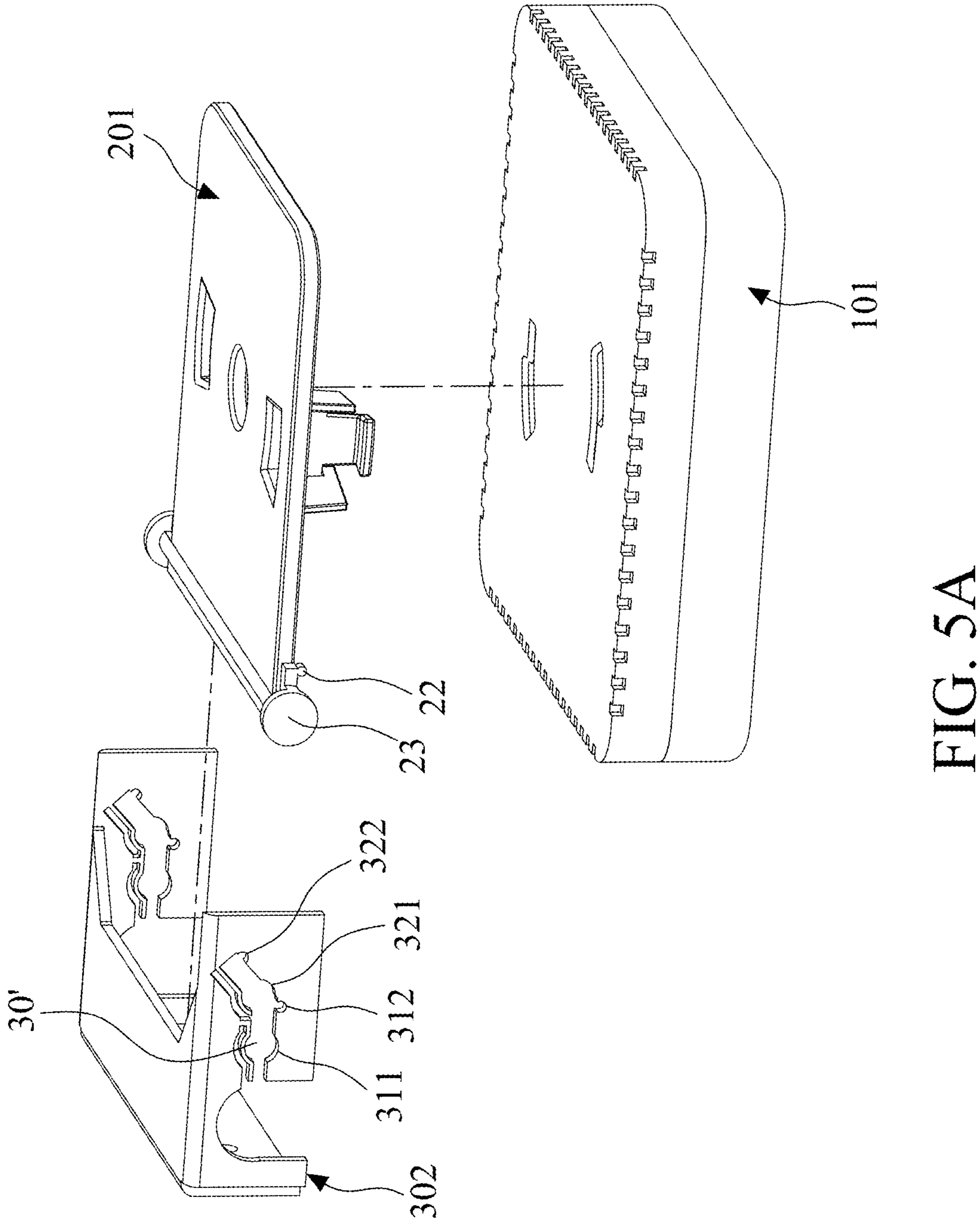
FIG. 5A is an exploded view of an electronic device of a second embodiment of the invention.
Figure 5B:
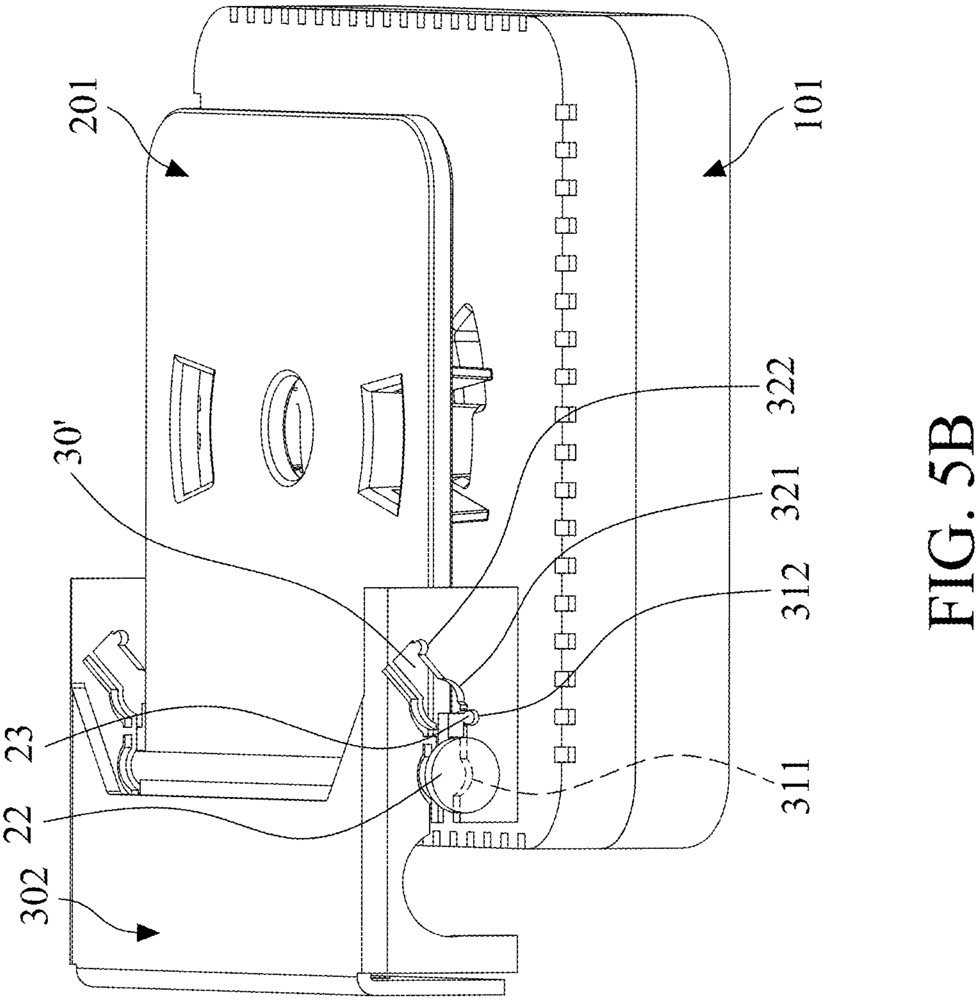
FIG. 5B shows the electronic device of the second embodiment of the invention, wherein the connection base is in a first position relative to the bracket.
Figure 5C:
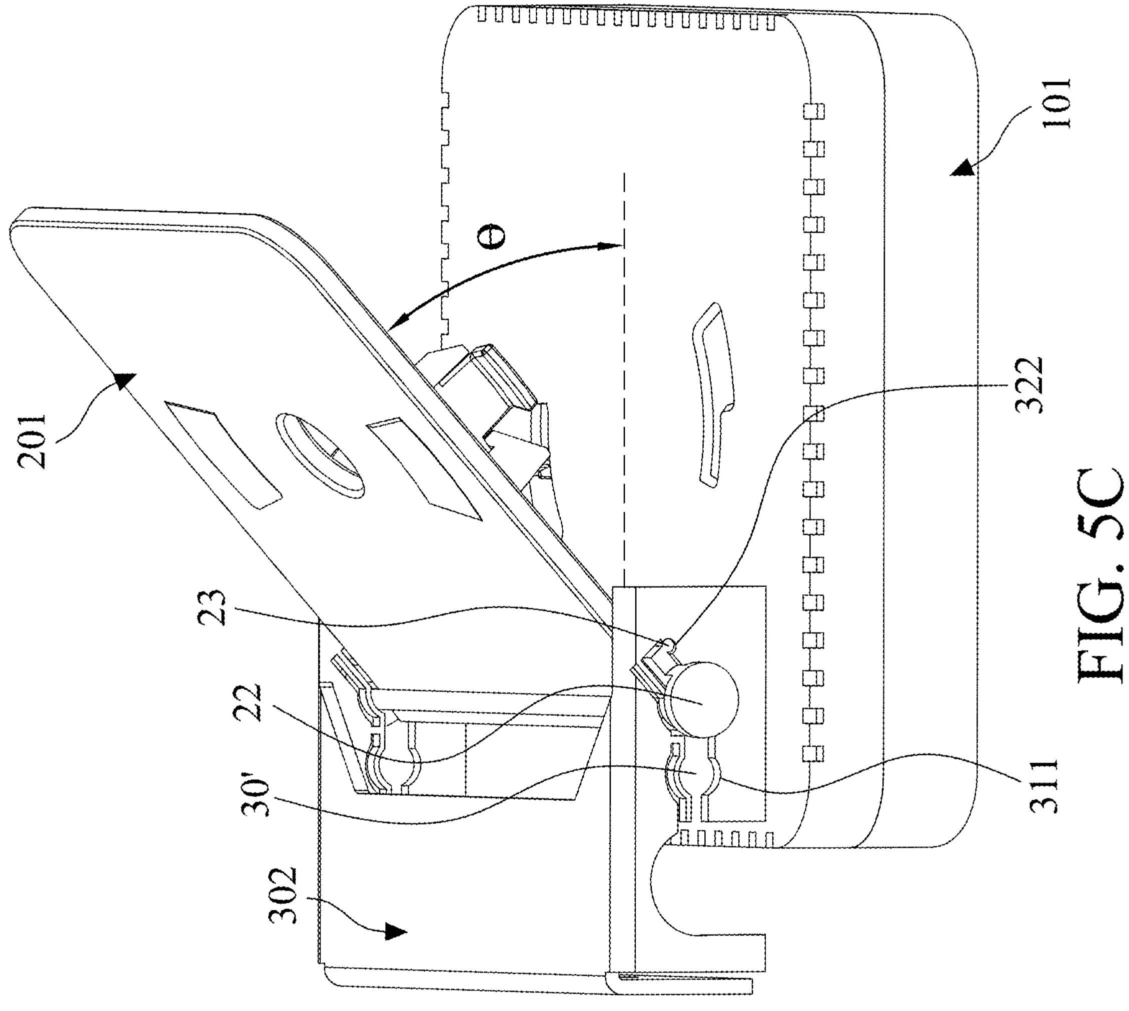
FIG. 5C shows the electronic device of the second embodiment of the invention, wherein the connection base is in a second position relative to the bracket.

FIG. 5A is an exploded view of an electronic device of a second embodiment of the invention. FIG. 5B shows the electronic device of the second embodiment of the invention, wherein the connection base is in a first position relative to the bracket. FIG. 5C shows the electronic device of the second embodiment of the invention, wherein the connection base is in a second position relative to the bracket. With reference to FIGS. 5A, 5B and 5C, in one embodiment, a second restriction portion 321 and a second positioning notch 322 are formed in the bracket connection slot 30' of the electronic device E2. In a second connection state (FIG. 5C), the second hook 22 abuts the second restriction portion 321. The positioning protrusion 23 is wedged against the second positioning notch 322. The connection base 201 is in a second position relative to the bracket 302.

With reference to FIGS. 5B and 5C, in one embodiment, an included angle θ is formed between the first position and the second position, and the included angle θ is greater than 0 degrees. For example, the included angle θ can be 30 degrees or 45 degrees. Therefore, the orientation of the electronic device can be modified.

Figure 6A:
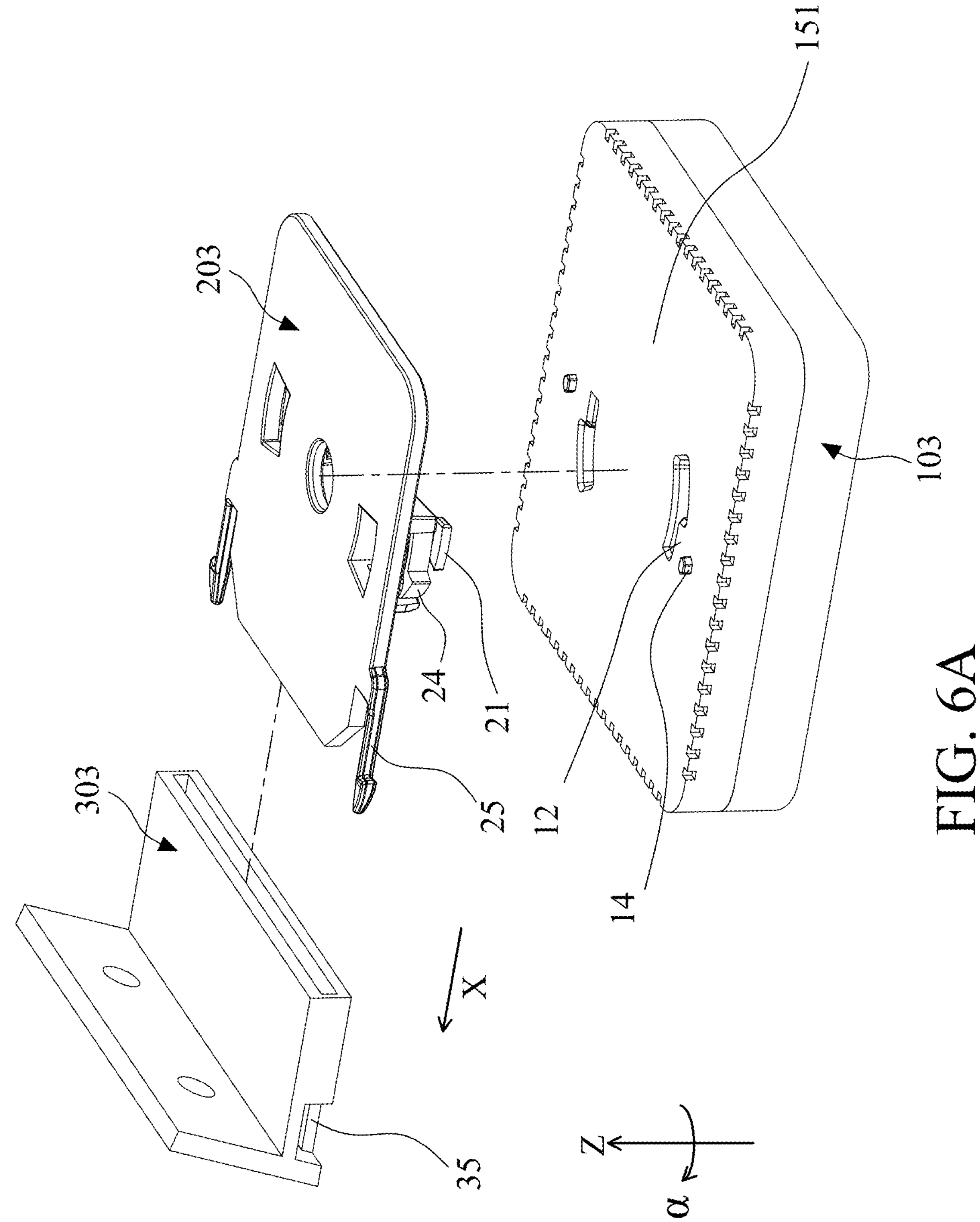
FIG. 6A is an exploded view of an electronic device of a third embodiment of the invention.
Figure 6B:
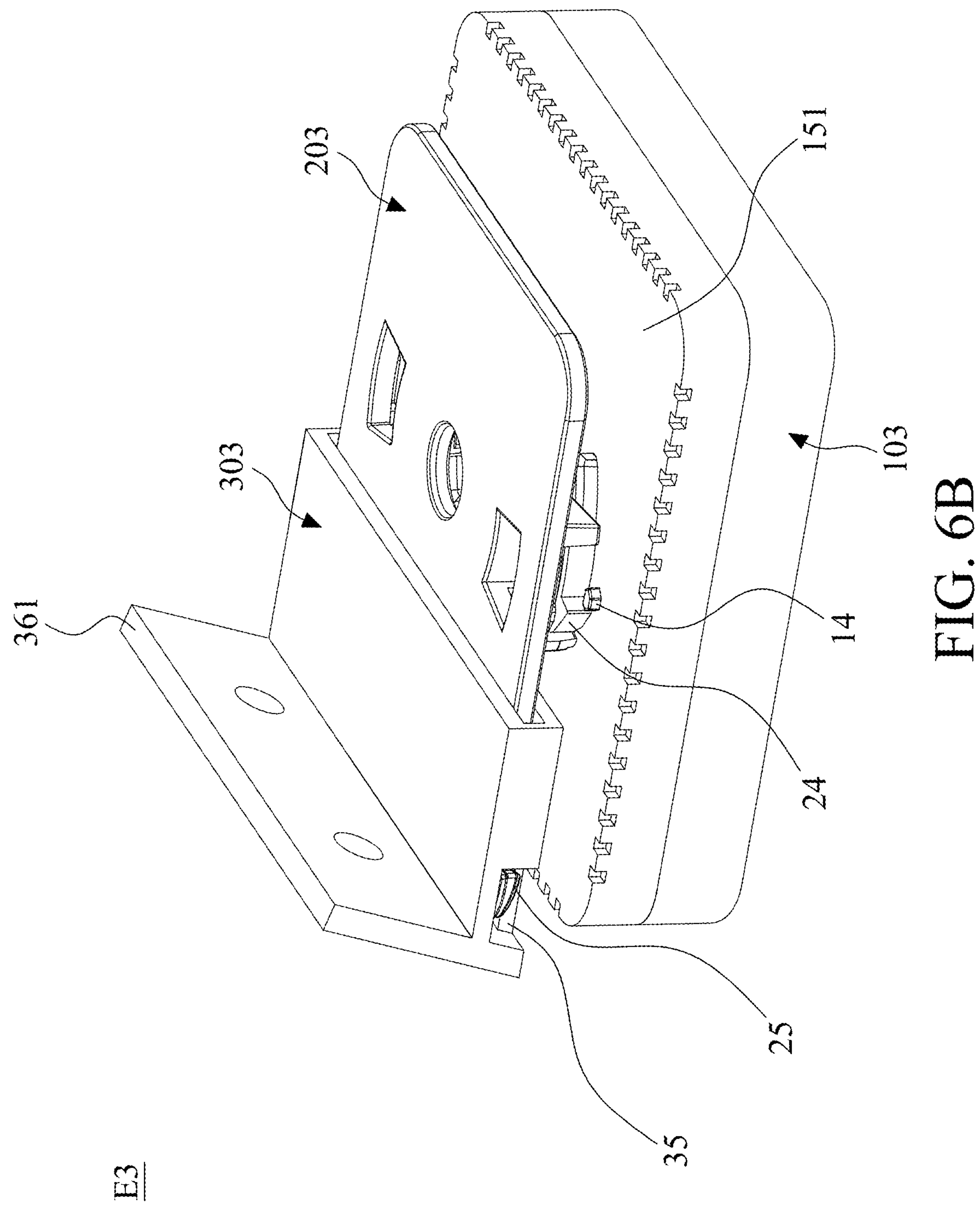
FIG. 6B is an assembled view of the electronic device of the third embodiment of the invention.

FIG. 6A is an exploded view of an electronic device of a third embodiment of the invention. FIG. 6B is an assembled view of the electronic device of the third embodiment of the invention. With reference to FIGS. 6A and 6B, in one embodiment, the connection base 203 of the electronic device E3 further comprises a base positioning portion 24. The device body 103 further comprises a body positioning portion 14. The body positioning portion 14 is formed on the outer surface 151 of the device body 103. When the connection base 203 is in the first orientation (FIG. 6B), the base positioning portion 24 is wedged against the body positioning portion 14.

With reference to FIGS. 6A and 6B, in one embodiment, the base positioning portion 24 is an elastic arm. The body positioning portion 14 is a protrusion. The elastic arm is adapted to be wedged against the protrusion. In this embodiment, the base positioning portion 24 is wedged against the body positioning portion 14 to restrict the movement of the connection base, and to provide tactile sense for user.

With reference to FIGS. 6A and 6B, in one embodiment, the first hook 21 abuts the device abutting portion 12 in an abutting direction Z. The base positioning portion 24 extends in a curved direction α. The abutting direction Z is perpendicular to the curved direction α.

With reference to FIGS. 6A and 6B, in one embodiment, the bracket 303 comprises a bracket connection track 35. The connection base 203 comprises a wedging arm 25. The wedging arm 25 is adapted to be wedged against the bracket connection track 35.

With reference to FIGS. 6A and 6B, in one embodiment, the wedging arm 25 is inserted into the bracket connection track 35 in the insertion direction X, which is parallel to the extending direction of the wedging arm 25.

With reference to FIG. 6B, in one embodiment, racket 303 comprises a bracket fastening portion 361. The bracket fastening portion 361 is adapted to be affixed to the mounting surface mentioned above (not shown, for example, wall). The design of the bracket fastening portion can be modified.

Figure 7:
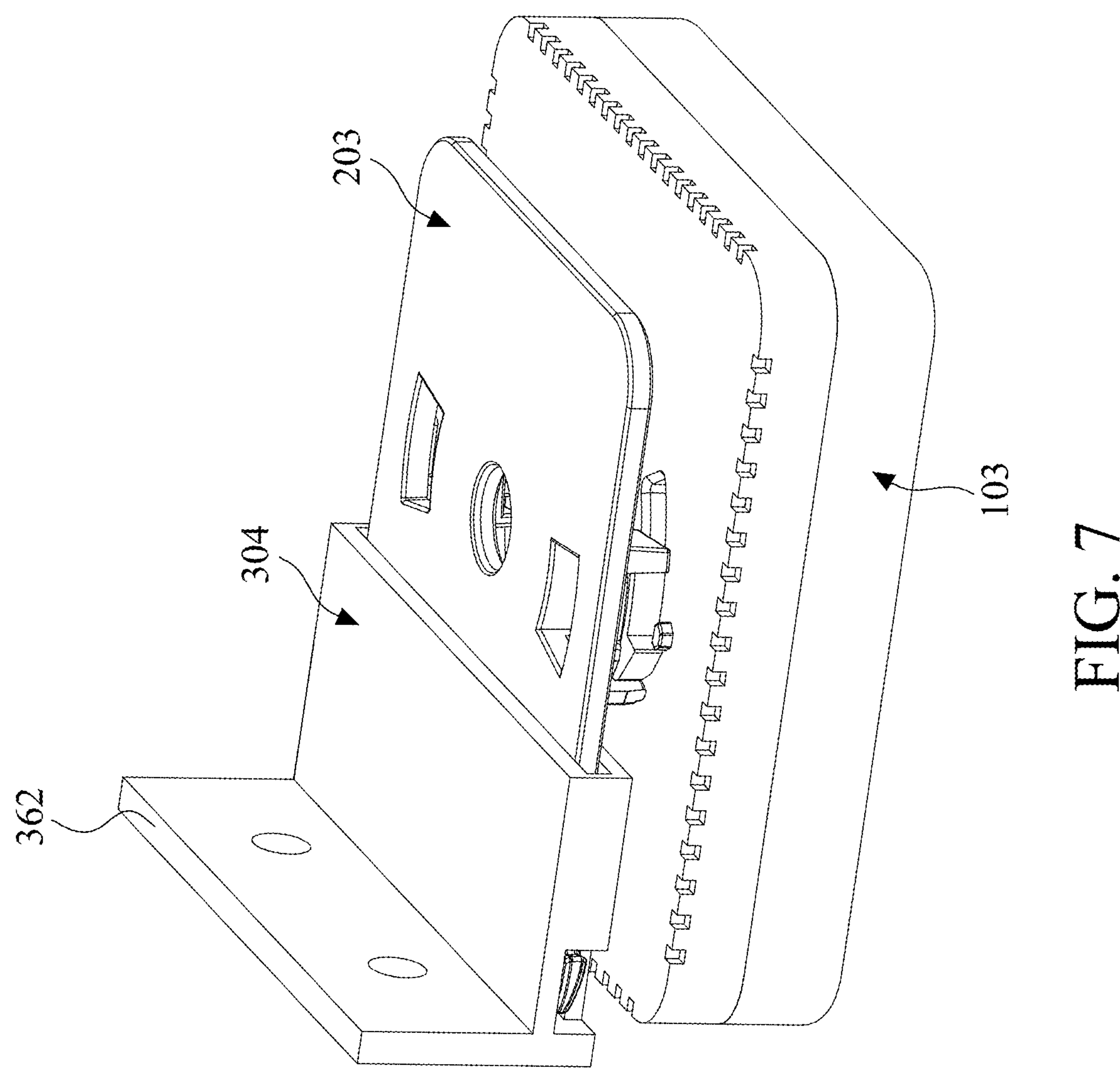
FIG. 7 is an assembled view of an electronic device of a fourth embodiment of the invention.

FIG. 7 is an assembled view of an electronic device of a fourth embodiment of the invention. With reference to FIG. 7, in this embodiment, the bracket 304 of the electronic device E4 includes a bracket fastening portion 362. The designed orientation of the bracket fastening portion 362 is modified. In the embodiment of the invention, different brackets can be utilized to match the mounting surface of different orientations (for example, celling or wall).

In the embodiment of the invention, the connection base is rotatably assembled to the device body. The connecting base is wedged against the bracket. The device body, the connection base and the bracket of the embodiment of the invention can be assembled each other without bolts. Utilizing the electronic device of the embodiment of the invention, the use of hand tools such as screwdrivers in the installation process can be significantly reduced, and the installation operations are easier for users.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, adapted to be disposed on a mounting surface, comprising:

a device body;

a connection base, wherein the connection base is connected to the device body, the connection base is adapted to be rotated between a first orientation and a second orientation relative to the device body, and when the connection base is in the first orientation, the connection base is connected to the device body, and when the connection base is in the second orientation, the connection base is separated from the device body; and a bracket, wedged against the connection base, wherein the bracket is adapted to be affixed to the mounting surface, wherein the connection base comprises a first hook, the device body comprises a device slot and a device abutting portion, the device abutting portion is connected to the device slot, and when the connection base is in the first orientation, the first hook abuts the device abutting portion, and when the connection base is in the second orientation, the first hook is separated from the device slot, wherein a first hook positioning portion is formed on the first hook, a device positioning portion is formed in the device slot, and when the connection base is in the first orientation, the device positioning portion is wedged against the first hook positioning portion.

2. The electronic device as claimed in claim 1, wherein the first hook positioning portion comprises a wedging opening, the device positioning portion comprises a wedging protrusion, and the wedging protrusion is adapted to be wedged against the wedging opening.

3. The electronic device as claimed in claim 2, wherein the first hook comprises a hook extending portion and a hook abutting portion, the hook abutting portion abuts the device abutting portion, and the first hook positioning portion is formed on the hook extending portion.

4. The electronic device as claimed in claim 1, wherein the connection base further comprises a base positioning portion, the device body further comprises a body positioning portion, the body positioning portion is formed on an outer surface of the device body, and when the connection base is in the first orientation, the base positioning portion is wedged against the body positioning portion.

5. The electronic device as claimed in claim 4, wherein the base positioning portion comprises an elastic arm, the body positioning portion comprises a protrusion, and the elastic arm is adapted to be wedged against the protrusion.

6. The electronic device as claimed in claim 5, wherein the first hook abuts the device abutting portion in an abutting direction, the base positioning portion extends in a curved direction, and the abutting direction is perpendicular to the curved direction.

7. The electronic device as claimed in claim 1, wherein the bracket comprises a bracket connection slot, the connection base comprises a second hook, and the second hook is connected to the bracket connection slot.

8. The electronic device as claimed in claim 7, wherein a first restriction portion and a first positioning notch are formed in the bracket connection slot, the connection base further comprises a positioning protrusion, and in a first connection state, the second hook abuts the first restriction portion, the positioning protrusion is wedged against the first positioning notch, and the connection base is in a first position relative to the bracket.

9. The electronic device as claimed in claim 8, wherein the bracket comprises an elastic sheet, the elastic sheet is disposed in the bracket connection slot, and in the first connection state, the elastic sheet abuts and restricts the second hook.

10. The electronic device as claimed in claim 8, wherein a second restriction portion and a second positioning notch are formed in the bracket connection slot, and in a second connection state, the second hook abuts the second restriction portion, the positioning protrusion is wedged against the second positioning notch, and the connection base is in a second position relative to the bracket.

11. The electronic device as claimed in claim 10, wherein an included angle is formed between the first position and the second position, and the included angle is greater than 0 degrees.

12. The electronic device as claimed in claim 1, wherein the bracket comprises a bracket connection track, the connection base comprises a wedging arm, and the wedging arm is adapted to be wedged against the bracket connection track.

13. The electronic device as claimed in claim 12, wherein the wedging arm is inserted into the bracket connection track in an insertion direction, and an extending direction of the wedging arm is parallel to the insertion direction.

14. A suspension structure, adapted to be disposed on a mounting surface, comprising:

a connection base, comprising a second hook and a positioning protrusion; and a bracket, comprising a bracket connection slot, wherein the bracket is adapted to be affixed to the mounting surface, the second hook is connected to the bracket connection slot, a first restriction portion and a first positioning notch are formed in the bracket connection slot, and in a first connection state, the second hook abuts the first restriction portion, the positioning protrusion is wedged against the first positioning notch, and the connection base is in a first position relative to the bracket, wherein a second restriction portion and a second positioning notch are formed in the bracket connection slot, and in a second connection state, the second hook abuts the second restriction portion, the positioning protrusion is wedged against the second positioning notch, the connection base is in a second position relative to the bracket, an included angle is formed between the first position and the second position, and the included angle is greater than 0 degrees.

15. The suspension structure as claimed in claim 14, wherein the bracket comprises an elastic sheet, the elastic sheet is disposed in the bracket connection slot, and in the first connection state, the elastic sheet abuts and restricts the second hook.

16. An electronic device, adapted to be disposed on a mounting surface, comprising:

a device body;

a connection base, wherein the connection base is connected to the device body, the connection base is adapted to be rotated between a first orientation and a second orientation relative to the device body, and when the connection base is in the first orientation, the connection base is connected to the device body, and when the connection base is in the second orientation, the connection base is separated from the device body; and a bracket, wedged against the connection base, wherein the bracket is adapted to be affixed to the mounting surface, wherein the bracket comprises a bracket connection slot, the connection base comprises a second hook, and the second hook is connected to the bracket connection slot, wherein a first restriction portion and a first positioning notch are formed in the bracket connection slot, the connection base further comprises a positioning protrusion, and in a first connection state, the second hook abuts the first restriction portion, the positioning protrusion is wedged against the first positioning notch, and the connection base is in a first position relative to the bracket.

* * * * *